United States Patent
Hironobu et al.

(10) Patent No.: US 7,196,269 B2
(45) Date of Patent: Mar. 27, 2007

(54) MOUNTING STRUCTURE FOR CIRCUIT BOARD TERMINAL

(75) Inventors: Masuoka Hironobu, Tokyo (JP); Yoshida Ryuji, Tokyo (JP); Hanabusa Kazuyoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/246,167

(22) Filed: Oct. 11, 2005

(65) Prior Publication Data

US 2006/0084291 A1    Apr. 20, 2006

(30) Foreign Application Priority Data

Oct. 18, 2004   (JP) ............... 2004-303410

(51) Int. Cl.
*H01R 4/18* (2006.01)
(52) U.S. Cl. .................. 174/94 R
(58) Field of Classification Search ............ 174/94 R, 174/267; 439/78, 82
See application file for complete search history.

(56) References Cited

U.S. PATENT DOCUMENTS

| | | | | |
|---|---|---|---|---|
| 4,979,903 | A | * | 12/1990 | Gosselin ............ 439/78 |
| 5,548,486 | A | * | 8/1996 | Kman et al. ............ 361/791 |
| 6,172,308 | B1 | * | 1/2001 | Katsumata et al. ......... 174/267 |
| 6,672,886 | B2 | * | 1/2004 | Billman ................ 439/82 |

FOREIGN PATENT DOCUMENTS

| | | |
|---|---|---|
| JP | 9-289329 | 11/1997 |
| JP | 2002-320386 | 10/2002 |
| JP | 2004-222486 | 8/2004 |
| JP | 2004-281727 | 10/2004 |

* cited by examiner

*Primary Examiner*—Chau N. Nguyen
(74) *Attorney, Agent, or Firm*—Oblon, Spivak, McClelland, Maier & Neustadt, P.C.

(57) ABSTRACT

A mounting structure for mounting a terminal at a circuit board, which allows the terminal to be easily mounted by using an automatic mounter is provided. This structure also assures a sufficient level of strength at the terminal mounting area, reduces the electrical resistance and improves the usable area ratio at the circuit board. Recessed electrodes are formed at an end of a circuit board and hollow through electrodes are disposed near the recessed electrodes at the circuit board. Each terminal includes a first vertical portion, a horizontal portion and a second vertical portion. The first vertical portion is fitted at the recessed electrodes and the second vertical portion is inserted at the through electrodes.

3 Claims, 11 Drawing Sheets

RELATED ART

FIG. 8A

RELATED ART

FIG. 8B

RELATED ART

FIG. 8C

RELATED ART

FIG. 8D

RELATED ART

FIG. 9A

RELATED ART

FIG. 9B

RELATED ART

FIG. 9C

RELATED ART

FIG. 9D

RELATED ART

FIG. 10A

RELATED ART

FIG. 10B

RELATED ART

FIG. 10C

RELATED ART

FIG. 10D

RELATED ART

FIG. 11A

RELATED ART

FIG. 11B

RELATED ART

FIG. 11C

RELATED ART

FIG. 11D

MOUNTING STRUCTURE FOR CIRCUIT BOARD TERMINAL

TECHNICAL FIELD

The present invention relates to a structure that may be adopted when mounting a terminal used to connect a circuit board having mounted there at electronic components with another board in a switching power source or the like.

BACKGROUND ART

When connecting a circuit board by stacking it on another board such as a motherboard, one end of a terminal is bonded to the circuit board with another end of the terminal bonded to the other board. Terminals used for such purposes include those shown in FIGS. 8 through 11. In FIGS. 8 through 11, FIGS. 8A, 9A, 10A and 11A each present a perspective of a terminal, FIGS. 8B, 9B, 10B and 11B are plan views showing the respective terminals in a mounted state, FIGS. 8C, 9C, 10C and 11C are front views of the respective terminals in the mounted state and FIGS. 8D, 9D, 10D and 11D are side elevations of the respective terminals in the mounted state.

Among these examples of the related art, ends of pin-type terminals 21 in FIGS. 8A through 8D on one side are each inserted at a through electrode 20 disposed at a circuit board 1 and are then bonded with solder joints 10, and the ends of the terminals on the other side are each inserted at a through electrode 3 of another board 2 and are bonded by solder joints 11. A specific mounting structure for this type of pin terminal is disclosed in Japanese Laid Open Patent Publication No. H9-289329.

FIGS. 9A through 9D show another type of pin-type terminal. Pin terminals 22 each include a horizontal portion 22a formed by bending the bottom thereof, which is bonded via a solder joint 11 onto a conductor present at the other board 2 such as a motherboard to achieve surface mounting. A specific mounting structure for this type of pin terminal 22 is disclosed in Japanese Laid Open Patent Publication No. 2004-281727.

The terminals in the example of the related art presented in FIGS. 10A through 10D each include a clip-type elastic mounting portion 23a at the upper end thereof, which clips an electrode 25 at the circuit board 1 and is then bonded via a solder joint 10. The bottom portion of each terminal 23 is bent to extend along the horizontal direction and the horizontal portion 23b is placed on a conductor at the other board 2 and is bonded via a solder joint 11. Specific mounting structures for this type of terminal 23 are disclosed in Japanese Laid Open Patent Publication No. 2002-320386 and Japanese Laid Open Patent Publication No. 2004-222486.

Terminals 24 in the example of the related art presented in FIGS. 11A through 11D each include a clip-type mounting portion 24a present at the upper end thereof, which is similar to that in the example presented in FIGS. 10A through 10D, and a straight bottom portion 24b that is inserted at a through electrode 3 at the other board 2 such as a motherboard and is bonded via a solder joint 11.

DISCLOSURE OF THE INVENTION

Terminals with straight mounting portions at which they are mounted at the circuit board 1, such as the pin terminals 21 and 22 shown in FIGS. 8A through 8D and FIG. 9A the 9D, may not achieve a sufficient level of bonding strength for the circuit board 1 and the pin terminals 21 and 22, particularly if they are used at locations where vibrations and the like tend to occur. In addition, there are other aspects of such terminals that need to be improved, including the electrical resistance and the area taken up by the terminal mounting portions which range from an end of the circuit board.

Figure 9A:
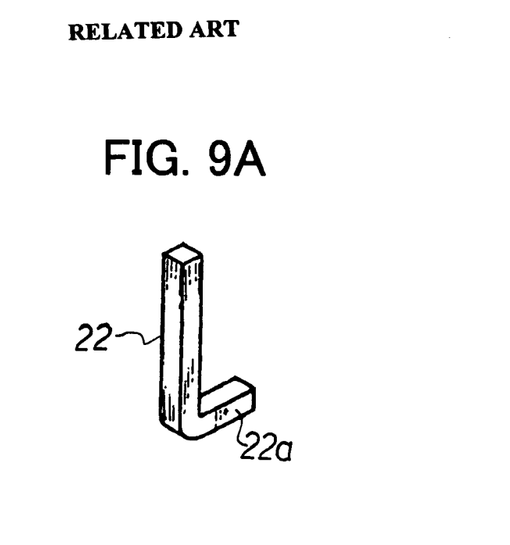
FIGS. 9A through 9D present another example of a mounting structure for circuit board terminals achieved in the related art, respectively in correspondence to FIGS. 8A through 8D.
Figure 9B:
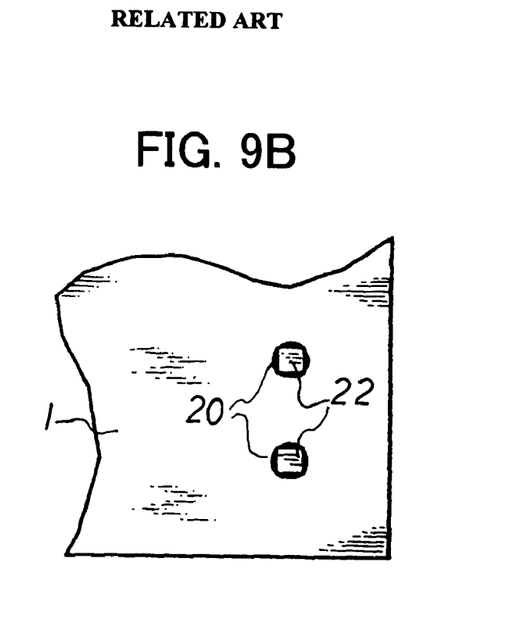
Figure 9C:
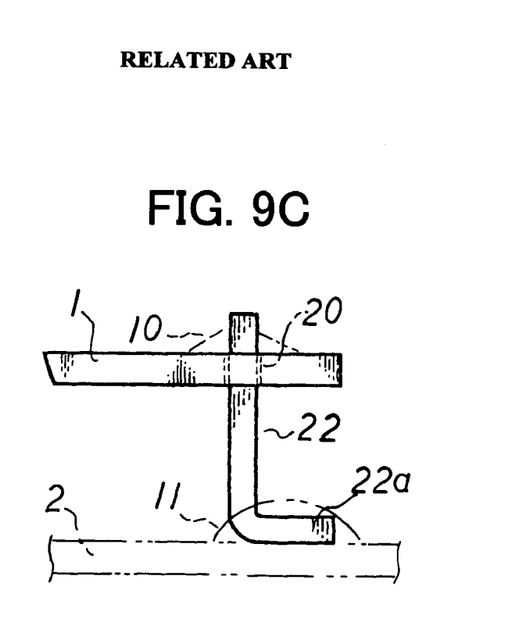
Figure 9D:
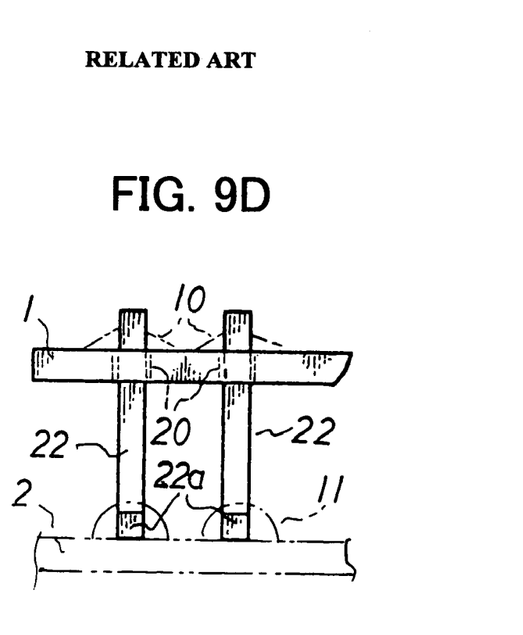
Figure 10A:
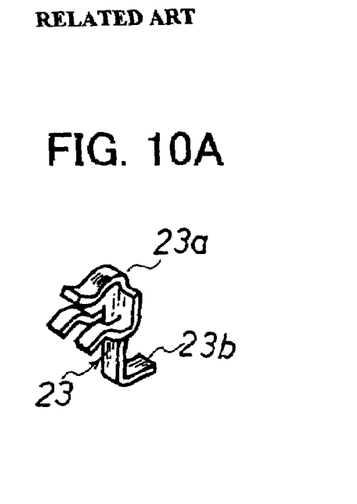
FIGS. 10A through 10D present yet another example of a mounting structure for circuit board terminals achieved in the related art, respectively in correspondence to FIGS. 8A through 8D.
Figure 10B:
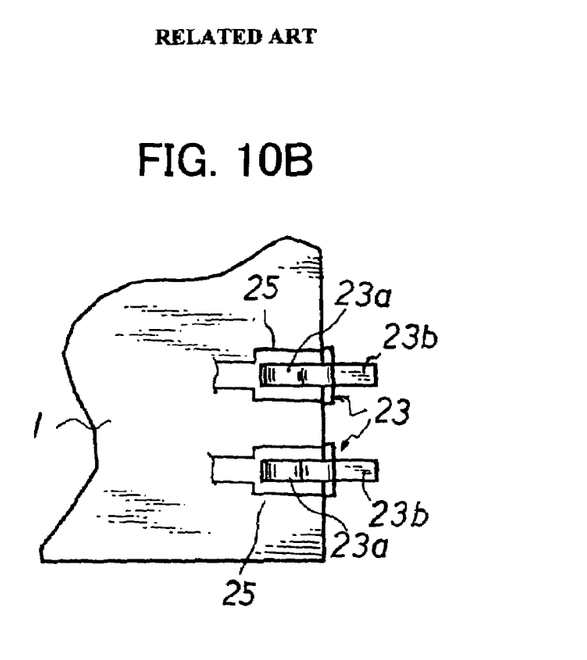
Figures 10C, 10D:
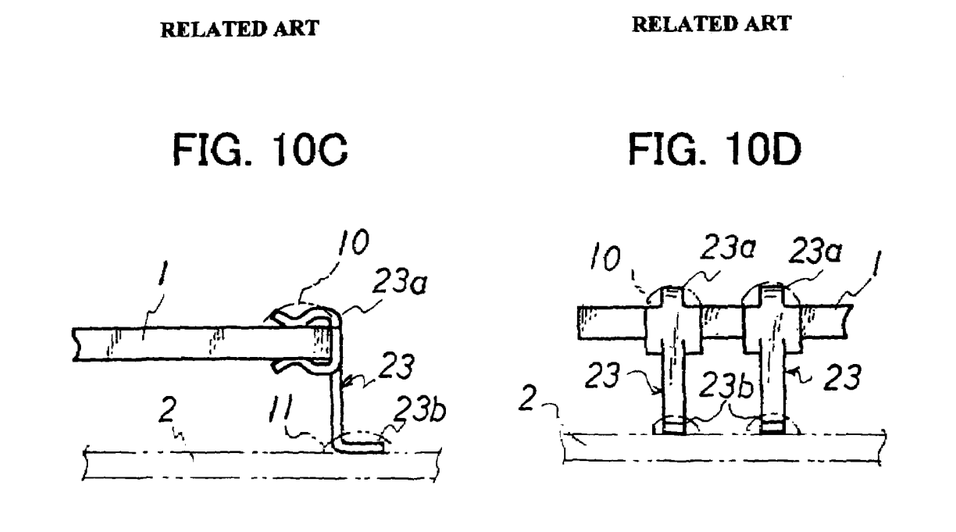
Figure 11A:
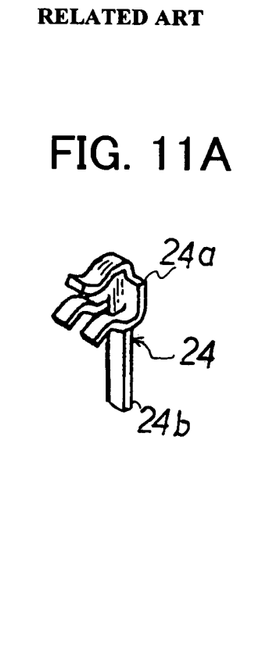
FIGS. 11A through 11D present yet another example of a mounting structure for circuit board terminals achieved in the related art, respectively in correspondence to FIGS. 8A through 8D.
Figure 11B:
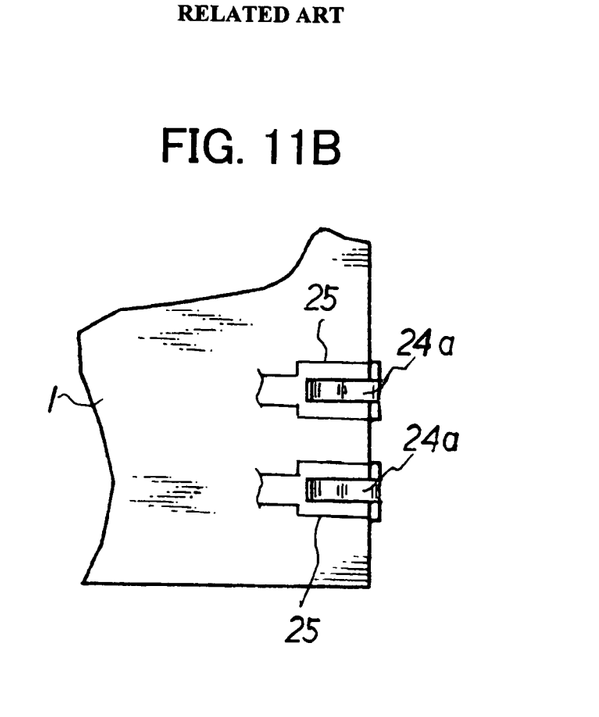
Figure 11C:
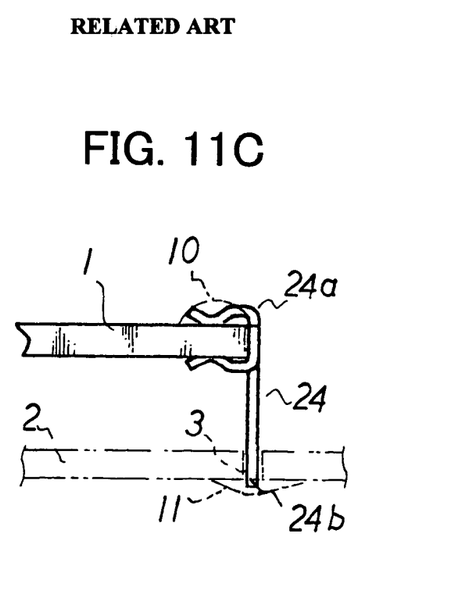
Figure 11D:
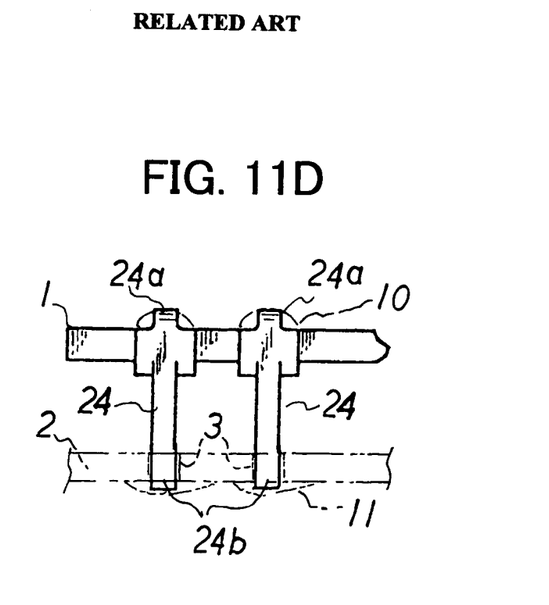

The terminals in FIGS. 9A the 9D, with the horizontal portions 22a soldered onto the other board 2, give rise to a problem in that the soldered areas where the horizontal portions 22a are bonded to the board 2 via the solder joints 11 are hidden by the circuit board 1 and thus cannot be optically inspected by reflecting light at the bonded areas.

In the case of terminals with clip-type mounting portions 23a (or 24a) such as those in FIGS. 10A through 10D or FIGS. 101A through 11D, it is necessary to provide two lead frames having mounting portions 23a (or 24a) formed therein, each on one side of the circuit board 1, and clip the end electrodes 25 at the circuit board 1 with the mounting portions 23a (or 24a) either by moving the lead frames closer to the circuit board 1 or moving the circuit board 1 to the lead frames. This complicates the manufacturing process and the concern of misalignment of the end electrodes 25 and the mounting portions 23a (24a) compounds the manufacturing difficulties.

An object of the present invention, which has been completed by addressing the problems discussed above, is to provide a mounting structure for circuit board terminals that allows the terminals to be mounted at a circuit board with ease by using an automatic mounter, facilitates the inspection of the mounting areas where the terminals are mounted at the other board, assures a sufficient level of strength at the terminal mounting areas, minimizes the electrical resistance and allows more efficient use of the circuit board area.

The mounting structure for a circuit board terminal according to the present invention includes one of a plurality of recessed electrodes disposed at an end of a circuit board to bond with each terminal for external connection. In addition, one or a plurality of hollow through electrodes are disposed in the vicinity of the recessed electrodes at the circuit board to be bonded with the external connection terminal. A connecting portion of the terminal at which the terminal is mounted onto the circuit board includes a first vertical portion, a horizontal portion and a second vertical portion formed by bending the front end of the horizontal portion. The first vertical portion is fitted in the recessed electrodes at the circuit board and is bonded via a conductive bonding material, and the second vertical portion is inserted at the through electrodes and is bonded via a conductive bonding material.

According to the present invention, each terminal is mounted with the first vertical portion and the second vertical portion at the mounting portion thereof respectively fitted into the recessed electrodes located at an end of the circuit board and inserted at the through electrodes present near the recessed electrodes. As a result, the terminals are mounted along the direction perpendicular to the circuit board, which allows the use of an automatic terminal mounter and ultimately facilitates the process of mounting the terminals at the circuit board.

Furthermore, each terminal is mounted at the surface of another substrate by setting a mounting portion of the terminal at the other board so as to face outward relative to the circuit board and thus, the state of the bond of the terminal with the other board achieved by a solder joint can be optically inspected from the side where the front surface of the other board is present.

Moreover, since the terminals are each bonded at the recessed electrodes disposed at an end of the circuit board and also at the through electrode located near the recessed electrodes, the mounting strength with which the terminals are mounted at the circuit board is improved and the terminals are mounted in a more stable condition. In addition, by connecting both the recessed electrodes and the through electrodes to a conductive pattern at the circuit board, the electrical resistance at the terminal mounting areas is lowered. Also, since the terminal mounting portions can be disposed near the ends of the circuit board, a greater area of the circuit board is left unoccupied by the terminals to improve the utilization rate of the circuit board and enable miniaturization of the circuit board.

BEST MODE FOR CARRYING OUT THE INVENTION

Figure 1A:
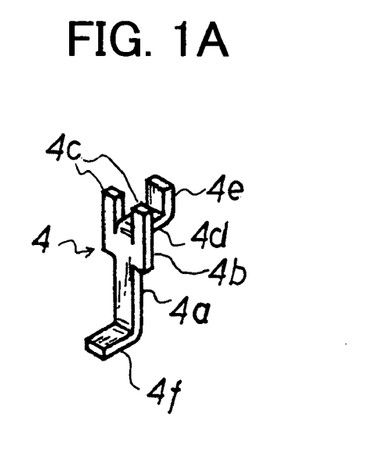
FIGS. 1A through 1D show an embodiment of the present invention, with FIG. 1A presenting a perspective of a terminal and FIGS. 1B, 1C and 1D respectively presenting a plan view, a front view and a side elevation of the mounting structure for mounting the terminals at a circuit board.

FIGS. 1A through 1D show the mounting structure for mounting terminals at a circuit board, achieved in an embodiment of the present invention. FIG. 1A is a perspective of terminal, whereas FIGS. 1B, 1C and 1D respectively present a plan view, a front view and a side elevation of the mounting structure adopted to mount the terminals at a circuit board 1. Reference numeral 1 in FIGS. 1A through 1D indicates a circuit board constituted of a resin such as a glass epoxy resin or a ceramic. Reference numeral 2 indicates another board that may be stacked together with the circuit board 1 to constitute an aggregate board or may itself constitute a motherboard. Reference numeral 4 indicates a highly conductive metal terminal for external connection, which may be constituted of copper or aluminum.

The terminals 4 are formed from a lead frame which is punched, bent and cut to yield the terminals. A mounting portion 4b of each terminal 4, at which the terminal 4 is mounted at the circuit board 1, is formed so as to have a greater width than a trunk 4a thereof. The mounting portion 4b includes a first vertical portion 4c extending along the same direction as the trunk 4a, a horizontal portion 4d branching out from the first vertical portion 4c and a second vertical portion 4e formed by bending the front end of the horizontal portion 4d. At the bottom of the trunk 4a, a horizontal portion 4f formed by bending the trunk, which is used to mount the terminal at another board 2 such as a motherboard, is present.

At each end of the circuit board 1, recessed electrodes 1a at which the first vertical portion 4c is mounted are present. In addition, near the recessed electrodes 1a at the circuit board 1, a through electrode 1b at which the second vertical portion 4e is inserted is present.

Figure 2:
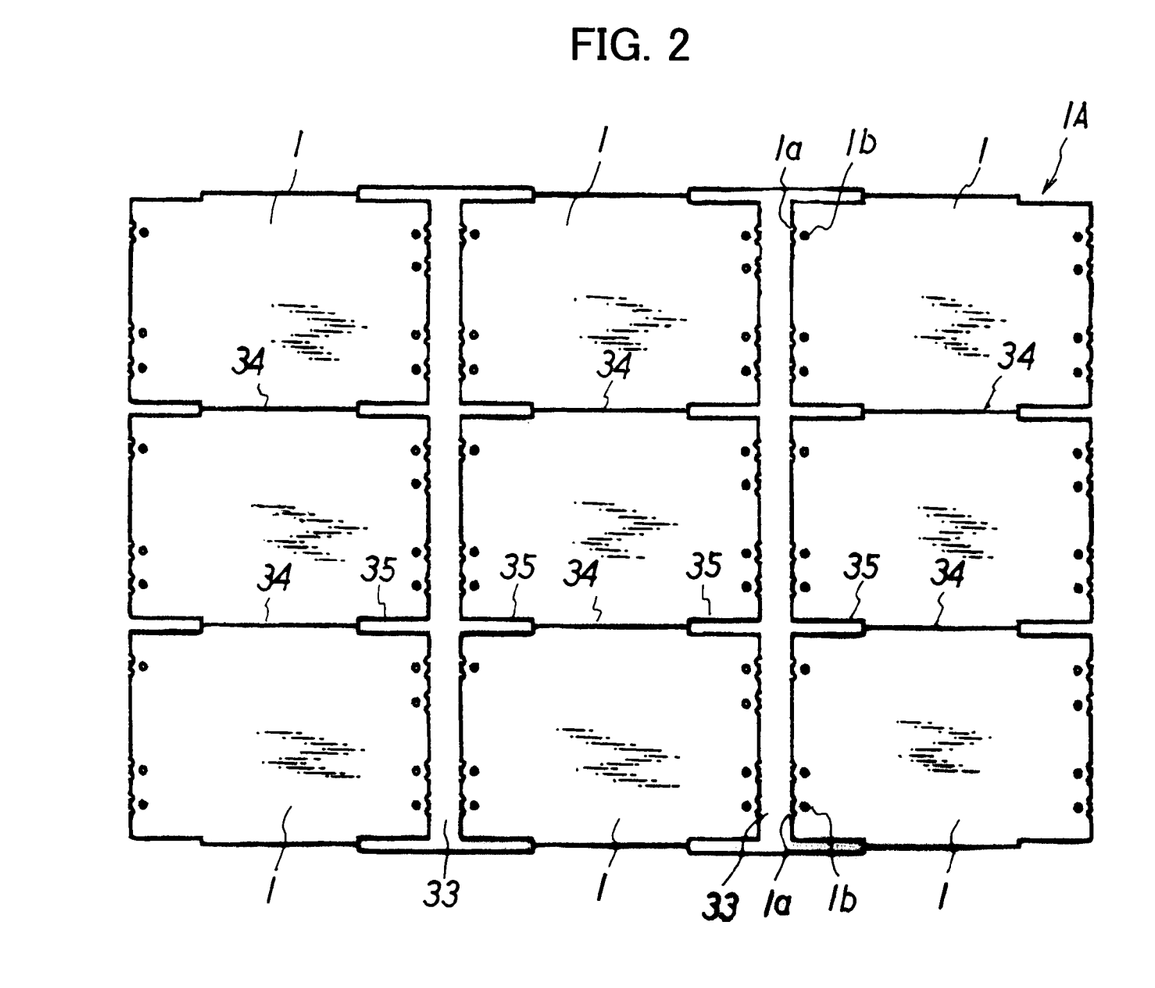
FIG. 2 is a plan view of a board base material from which the circuit board in FIG. 1 is obtained.
Figure 3:
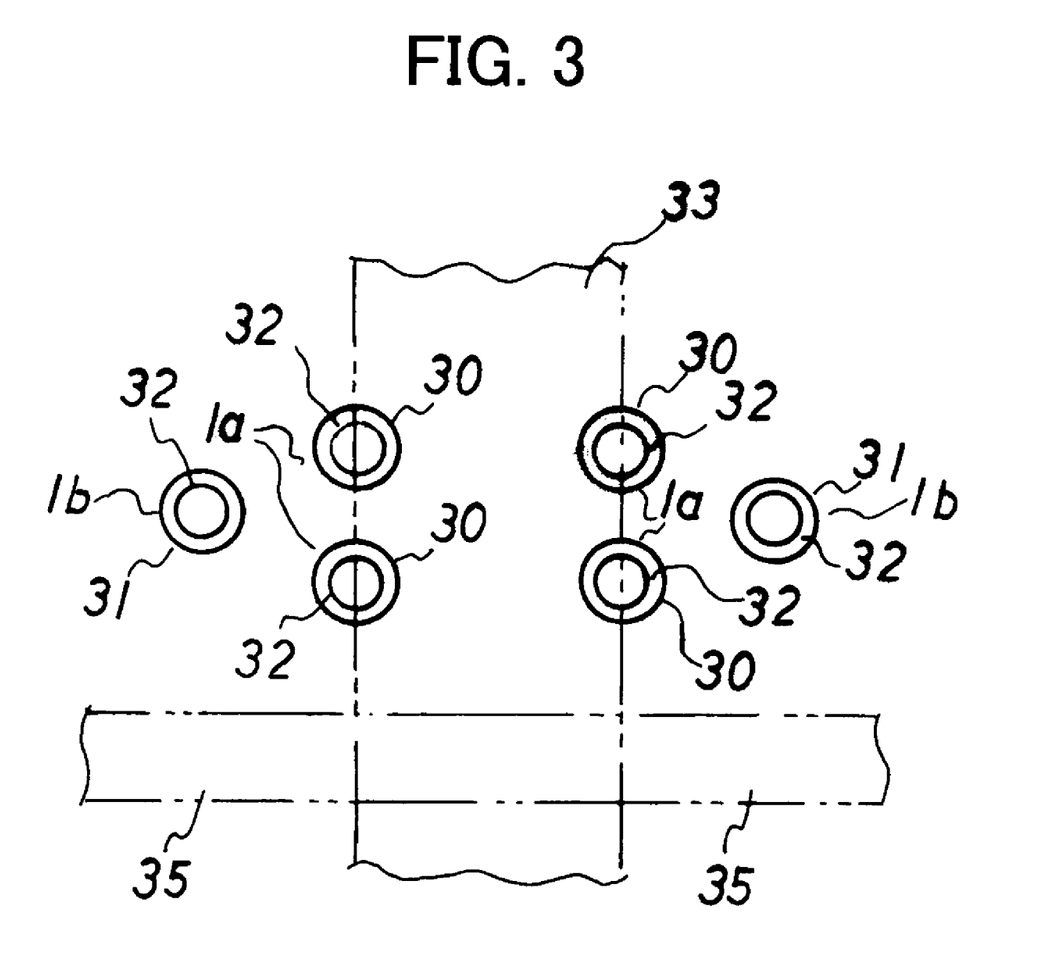
FIG. 3 is a plan view illustrating the process of forming recessed electrodes in the board base material shown in FIG. 2.
Figure 4A:
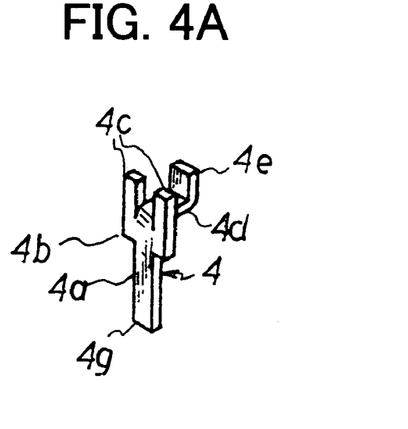
FIGS. 4A through 4D show another embodiment of the present invention, respectively in correspondence to FIGS. 1A through 1D.
Figure 4B:
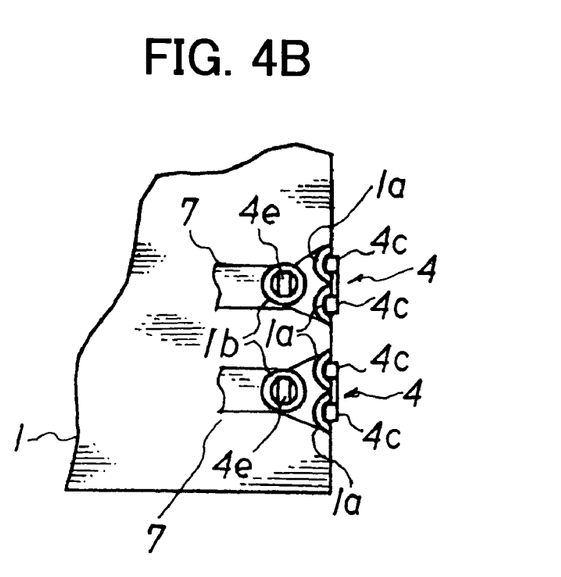
Figure 4C:
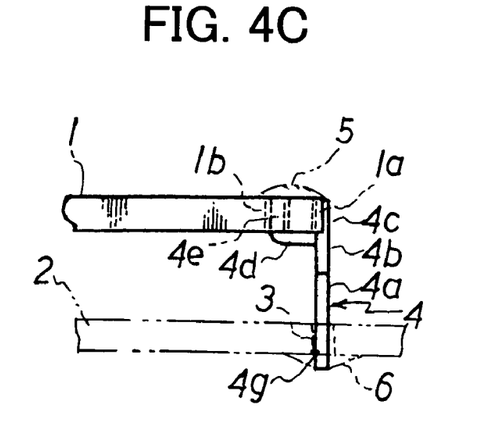
Figure 4D:
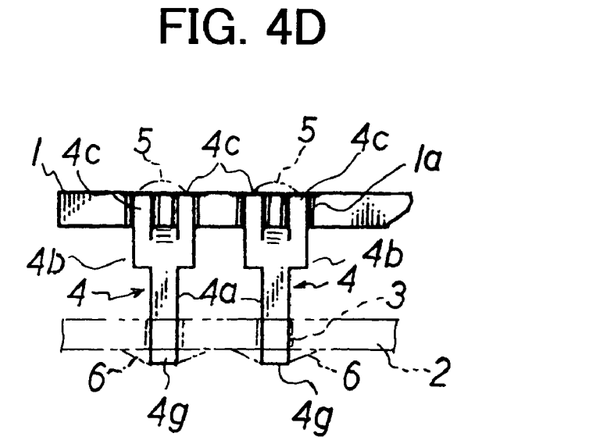
Figure 5A:
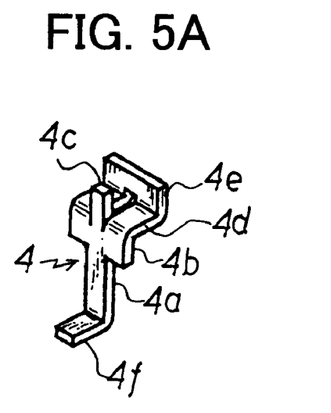
FIGS. 5A through 5D show yet another embodiment of the present invention, respectively in correspondence to FIGS. 1A through 1D.
Figure 5B:
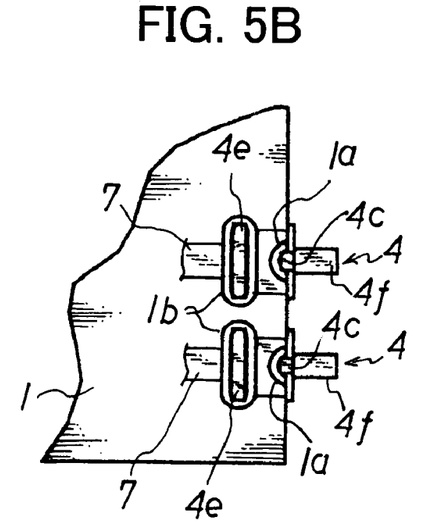
Figure 5C:
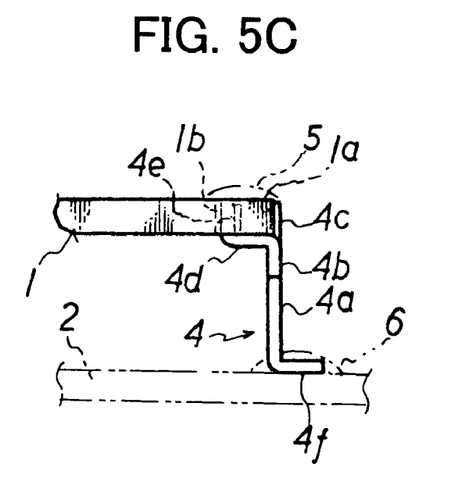
Figure 5D:
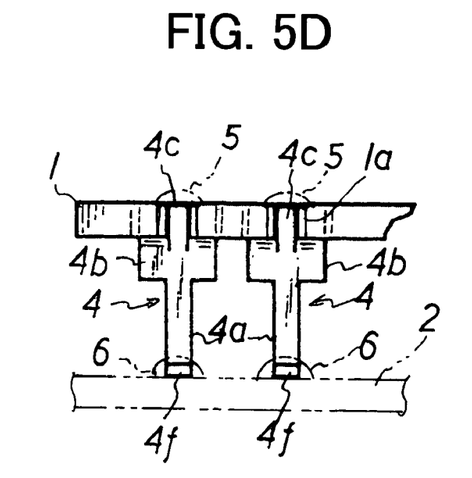
Figure 6A:
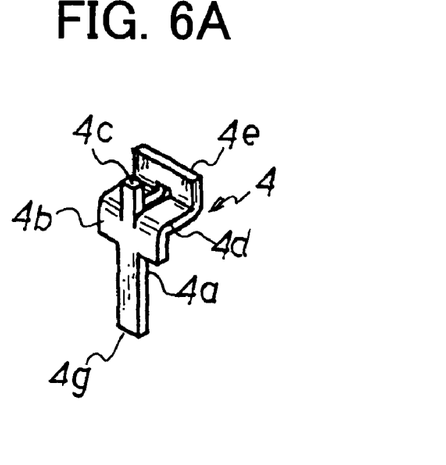
FIGS. 6A through 6D show yet another embodiment of the present invention, respectively in correspondence to FIGS. 1A through 1D.
Figure 6B:
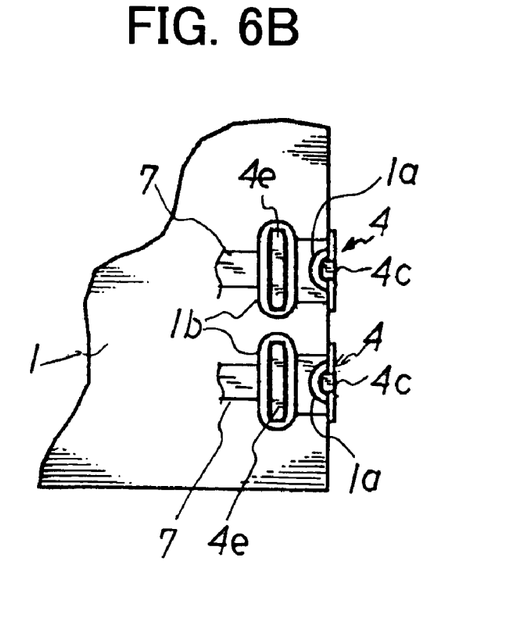
Figure 6C:
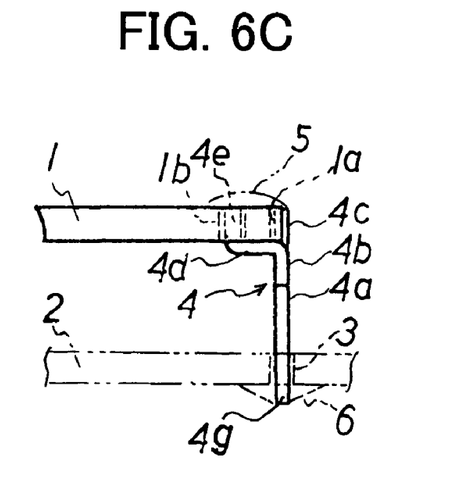
Figure 6D:
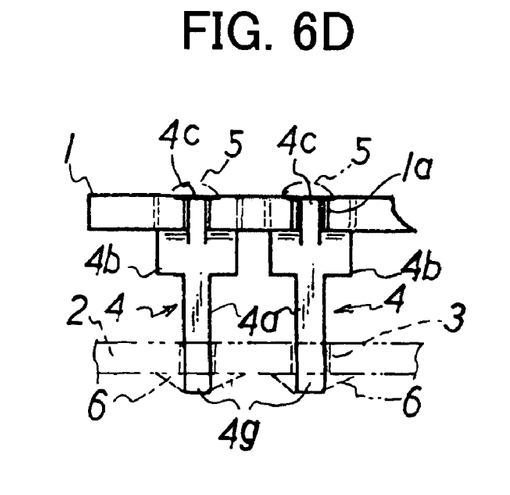

FIG. 2 is a plan view of the board base material from which the circuit board 1 is yielded. As shown in FIG. 3, through holes 31 to be used to form the through electrodes 1b and through holes 30 to be used to form the recessed electrodes 1a are formed in advance at the board base material 1A. At such a board base material, conductors 32 are formed inside the through holes 30 and 31 through electroless plating or electrolytic plating. In addition, at the front surface or at the front and rear surfaces of the board base material 1A, a conductive pattern for component mounting, circuit connection and terminal connection is formed.

After forming the through holes 30 and 31, the conductors 32 and the conductive pattern, slits 33 to be used to form the recessed electrodes 1a and separate the base material into individual circuit boards 1 are formed through punching along the longitudinal direction in the figure. Namely, the recessed electrodes 1a each having a semicircular recess are formed by cutting the base material substantially through centers of the through holes 30. In addition, V-shaped grooves 34 to be used to separate the base material into individual circuit boards 1 and slits 35 to be used to facilitate the separation are formed along the direction perpendicular to the direction in which the slits 33 extend.

Subsequently, electronic components may be mounted at the rear surface of the board base material 1A (the surface facing opposite the other board 2) by coating the rear surface with a solder paste pattern, setting the electronic components at the rear surface and placing the board base material in a reflow furnace to fix the electronic components onto the board base material 1A. After the electronic components are mounted at the rear surface, the terminals 4 are mounted at the rear surface of the board base material 1A with an automatic terminal mounter (not shown). Namely, as the first vertical portion 4c of each terminal 4 is fitted at the recessed electrodes 1a, the second vertical portion 4e is concurrently inserted at the corresponding through electrode 1b. At this time, it is ensured that the vertical portions 4c and 4e of the terminals 4 do not project out beyond the surface of the board base material 1A or project out only by a small extent beyond the surface of the board base material 1A so as to allow a solder paste to be printed onto the front surface of the circuit board 1.

Figure 1B:
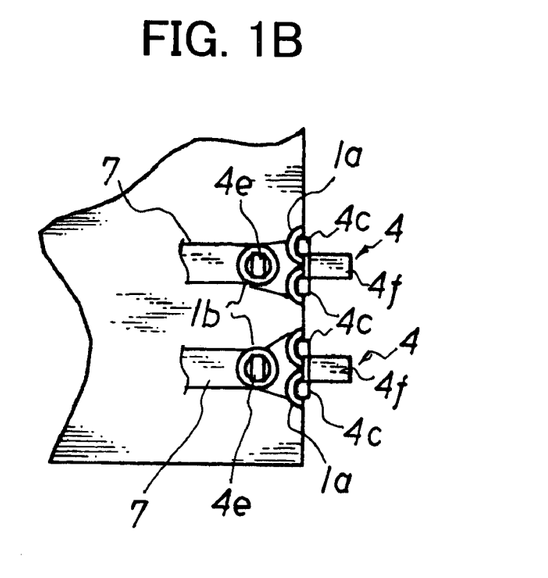
Figure 1C:
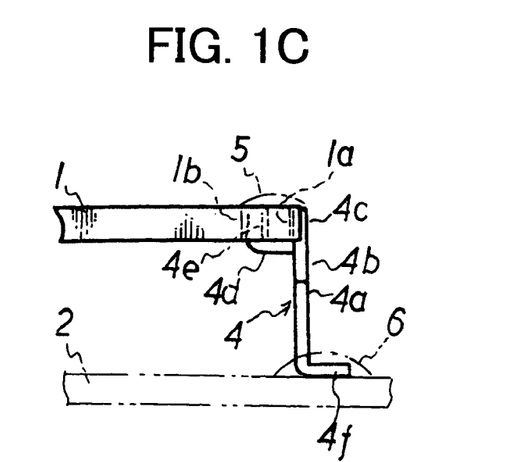
Figure 1D:
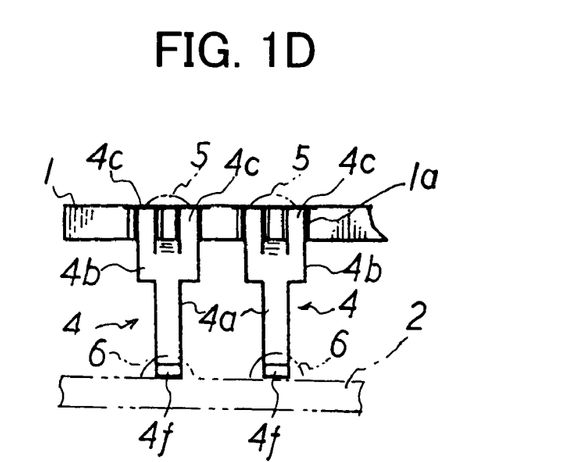

Then, the solder paste is applied onto electronic component mounting areas (not shown) and the bonding areas where the terminals 4 are bonded with the recessed electrodes 1a and the through electrodes 1b at the front surface of the board base material 1A. Next, electronic components (not shown) are placed on the circuit board 1 and the circuit board 1 is then processed in a reflow furnace to fix the electronic components and bond the terminals 4 through soldering. FIGS. 1C and 1D show the terminals 4 bonded to the recessed electrodes 1b and the through electrodes 1a via solder joints 5.

Subsequently, the board base material 1A is separated into individual circuit boards 1 along the V-shaped grooves 34 mentioned earlier. It is to be noted that the terminals 4 may be soldered onto each circuit board 1 by dipping the portions of the terminals 4 to be soldered while the circuit board 1 alone is immersed in a solder bath. However, the reflow soldering process described earlier, which allows the terminals to be soldered onto a plurality of circuit boards 1 in the board base material 1A simultaneously, is more efficient.

A circuit board adopting the structure described above is then mounted onto another substrate 2 such as a motherboard. The circuit board 1 is mounted by bonding the horizontal portions 4f at the bottoms of the terminals 4 onto the other board 2 via solder joints 6.

As described above, the terminals 4 according to the present invention are each mounted at the circuit board 1 with the first and second vertical portions 4c and 4e thereof respectively fitted at and inserted into the recessed electrodes 1a located at an end of the circuit board 1 and the through electrode 1b located near the recessed electrodes 1a. This means that the terminals 4 can be mounted along the direction perpendicular to the circuit board 1. As a result, the use of an automatic mounter is enabled to mount the terminals 4, which facilitates the process of mounting the terminals 4 at the circuit board 1.

In addition, when the terminals are mounted at the other board 2 through surface mounting as in the embodiment, the horizontal portions 4f constituting mounting feet to be mounted at the other board 2 should be set further outward relative to the circuit board 1 to allow the bonding state of the terminals 4 achieved by the solder joint 6 to be optically inspected from the front surface side of the other board 2.

Since the terminals 4 are each bonded at the recessed electrodes 1a located at an end of the circuit board 1 and the through electrode 1b located near the recessed electrodes 1a, the mounting strength with which the terminals 4 are mounted at the circuit board 1 improves and the terminals 4 are allowed to function in a stable manner. Furthermore, by connecting both the recessed electrodes 1a and the through electrodes 1b to a conductive pattern 7 (see FIG. 1B) at the circuit board 1 as in the embodiment, the level of electrical resistance at the terminal mounting areas can be lowered.

In addition, since the width of the mounting portions 4b of the terminals 4 to be mounted near the ends of the circuit board 1, i.e., the width of the areas taken up by the recessed electrodes 1a and the through electrodes 1b, which range from the ends of the circuit board 1, can be set to a small value, the usable area of the circuit board 1 (the area other than the areas taken up by the terminals 4 mounted onto the circuit board 1) increases to improve the utilization rate of the circuit board 1. Alternatively, the area of the circuit board 1 other than the mounting areas over which the terminals 4 are mounted at the circuit board 1 may be left unchanged from the related art and, in such case, the overall area of the circuit board 1 can be reduced to enable miniaturization of the circuit board 1.

FIGS. 4A through 4D show another embodiment of the present invention in correspondence to FIGS. 1A through 1D. In this embodiment, the terminals 4 each include a straight mounting portion 4g to be mounted at the other board 2. In this case, the mounting portion 4g to be mounted at the other board 2 is inserted at a through electrode 3 at the other board 2 and is bonded via a solder joint 6.

Advantages similar to those described earlier are achieved in this embodiment, as well. In addition, the bonding state of the terminals 4 inserted at the through electrodes 3 at the other board 2, as in the embodiment, can be optically inspected by radiating light from the rear side of the other board 2 and monitoring the reflected light.

FIGS. 5A through 5D show yet another embodiment of the present invention adopting alternative structures in the mounting portions to be mounted at the circuit board 1 and in the recessed electrodes 1a and the through electrodes 1b at the circuit board 1. Namely, the terminals 4 each include a first vertical portion 4c with a single vertical portion located at the center, a horizontal portion 4d with two horizontal portions extending on the left and right sides of the first vertical portion 4c and a second vertical portion 4e constituted with a single vertical portion ranging along the vertical direction at the front end of the horizontal portion.

In conjunction with the single vertical portion located at the center to constitute the first vertical portion 4c of the terminal 4, a single recessed electrode 1a and a single through electrode 1b assuming the shape of an elongated groove are formed. The first vertical portion 4c is fitted at the recessed electrode 1a and the second vertical portion 4e is inserted at the through electrode 1b at the circuit board 1, before the vertical portions are bonded via solder joints 5.

Advantages similar to those of the embodiment shown in FIGS. 1A through 1D are also achieved in this embodiment.

FIGS. 6A through 6D present a mounting structure achieved by modifying the embodiment shown in FIGS. 5A through 5D, in which the terminals each include a straight mounting portion to be mounted at the other board 2. Advantages similar to those described in reference to FIGS. 4A through 4D are achieved in this example. In addition, the embodiment shown in FIGS. 6A through 6D, which adopts a mounting structure for mounting the terminals at the other board 2 identical to that shown in FIGS. 4A through 4D enables inspection of the bonding areas where the terminals are bonded at the other board 2 via the solder joints, as in the embodiment shown in FIGS. 4A through 4D.

In the embodiment shown in FIGS. 5A through 5D or FIGS. 6A through 6D, the second vertical portion 4e may include two separate vertical portions instead of a single vertical portion ranging vertically at the front end of the horizontal portion 4d. In correspondence to each second vertical portion 4e that includes two vertical portions, two round through electrodes 1b may be formed, each in correspondence to one of the two vertical portions constituting the second vertical portion, instead of a through electrode 1b formed as an elongated groove.

Figure 7A:
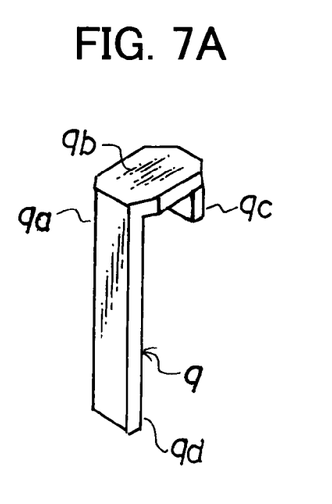
FIG. 7A is a perspective showing a terminal achieved in another embodiment of the present invention.
Figure 7B:
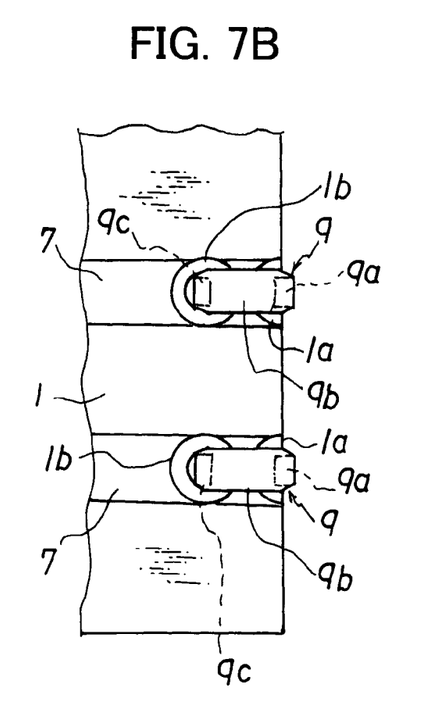
FIGS. 7B and 7C are respectively a plan view and a sectional view of the mounting structure adopted in conjunction with the terminals.
Figure 7C:
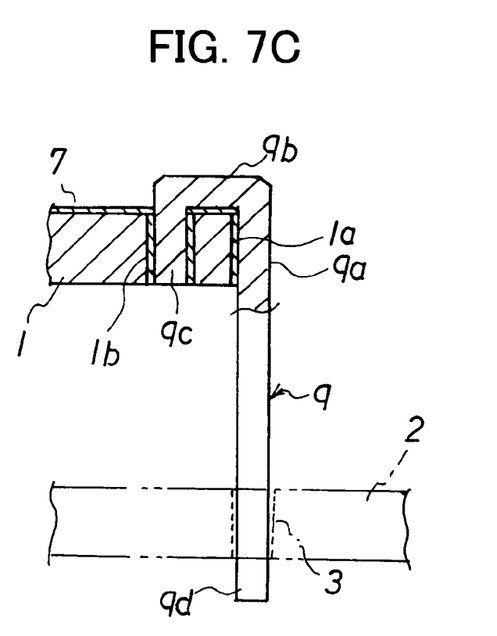
Figure 8A:
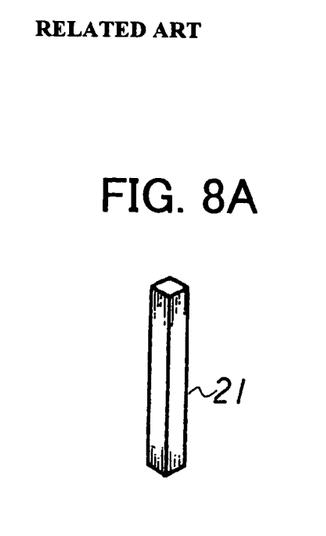
FIGS. 8A through 8D present an example of a mounting structure for a circuit board terminal achieved in the related art, with FIG. 8A presenting a perspective of a terminal and FIGS. 8B, 8C and 8D respectively presenting a plan view, a front view and a side elevation of the mounting structure adopted to mount the terminals at a circuit board.
Figure 8B:
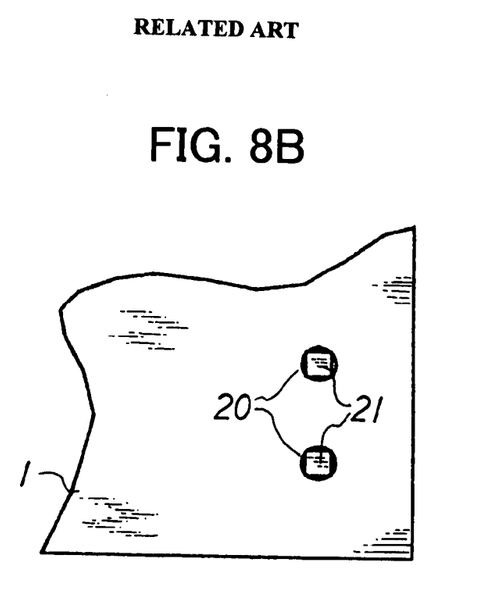
Figure 8C:
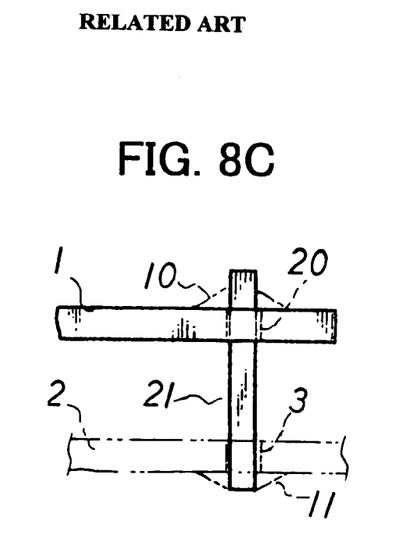
Figure 8D:
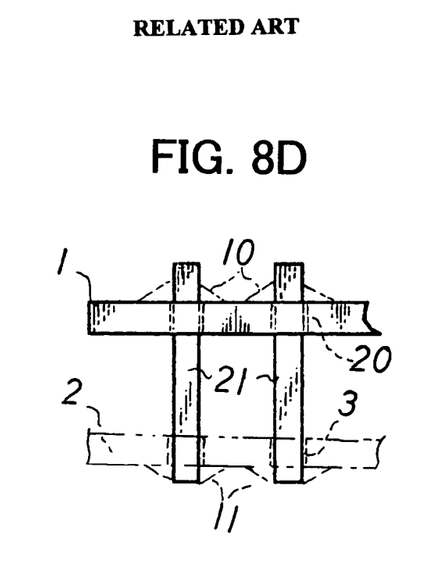

FIGS. 7A through 7C show yet another embodiment of the present invention. The mounting portion at which each terminal 9 achieved in the embodiment is mounted at the circuit board 1 includes a first vertical portion 9a constituted with the upper portion of the trunk, a horizontal portion 9b formed by bending the upper end of the first vertical portion and a second vertical portion 9c extending downward from the front end of the horizontal portion.

Unlike in the preceding embodiments, the terminals 9 achieved in the embodiment are each mounted by inserting the second vertical portion 9c at a through electrode 1b from the front surface side of the circuit board 1 and fitting the first vertical portion 9a at a recessed electrode 1a. If such terminals 9 are mounted at the circuit board 1 before mounting electronic components at the circuit board 1, the horizontal portions 9b will be left projecting out at the top surface of the circuit board 1 and, in such a case, a solder paste cannot be applied through printing onto the front surface of the circuit board 1. For this reason, the terminals 9 must be mounted after applying the solder paste onto the circuit board 1, mounting the electronic components at the circuit board 1 and processing the circuit board 1 in a reflow furnace. The terminals 9 may be soldered by dipping the portions of the terminals 9 to be soldered into a solder bath or the like.

It is to be noted that the terminals 9 achieved in the embodiment having straight bottom portions 9d are mounted at the other board 2 by inserting and soldering the bottom portions 9d at through electrodes 3 formed at the other board 2. Alternatively, the bottom portion of each terminal 9 may be bent so as to form a horizontal portion that can be used to mount the terminal 9 at the other board 2 through surface mounting.

The terminals 9 achieved in the embodiment shown in FIGS. 7A through 7C, too, can be mounted at the circuit board 1 with an automatic mounter, as in the preceding embodiments. In addition, regardless of whether the terminals 9 have straight bottom portions or horizontally bent bottom portions, the soldered areas can be inspected without difficulty. Furthermore, since the first and second vertical portions 9a and 9c are bonded with the recessed electrodes 1a and the through electrodes 1b the mounting strength is improved, the electrical resistance is lowered and effective use of the available area at the circuit board 1 for miniaturization of the circuit board 1 is achieved.

The bonding material used to bond the terminals 4 with the recessed electrodes 1a and the through electrodes 1b and with the other board 2 when carrying out the present invention may be a conductive adhesive instead of solder.

The invention claimed is:

1. A mounting structure for a circuit board terminal, comprising:
   one or a plurality of recessed electrodes, at which at least one terminal for external connection is to be connected, disposed at an end of a circuit board in correspondence to each terminal;
   one or a plurality of hollow through electrodes, at which said one or a plurality of external connection terminals is to be connected, disposed near said recessed electrodes at said circuit board in correspondence to each terminal; and
   a mounting portion of said terminal, which is mounted at said circuit board, including a first vertical portion, a horizontal portion and a second vertical portion formed in the same direction as said first vertical portion by bending the front end of said horizontal portion; wherein
   said first vertical portion is fitted at said recessed electrode and bonded to said circuit board via a conductive bonding material and said second vertical portion is inserted at said through electrode and bonded with said circuit board via a conductive bonding materials,
   said terminal is mounted at said circuit board by ensuring that said first vertical portion and said second vertical portion do not project out beyond the front surface of said circuit board or that said first vertical portion and said second vertical portion project out beyond the front surface of said circuit board only by a very small extent, and
   the end of said terminal on the side opposite from said mounting portion is bonded to a board other than said circuit board via a conductive bonding material.

2. A mounting structure for a circuit board terminal according to claim 1, wherein:
   said mounting portion at which said terminal is mounted at said circuit board is formed to have a greater width than the width of a trunk of said terminal;
   said first vertical portion extends along the direction matching the direction in which said trunk extends;
   said horizontal portion includes two portions branching out from two sides of said first vertical portion; and
   said second vertical portion includes a single vertical portion formed by bending the front ends of said two portions constituting said horizontal portion.

3. A mounting structure for a circuit board terminal according to claim 1, comprising:
   said mounting portion at which said terminal is mounted at said circuit board is formed to have a greater width than the width of a trunk of said terminal;
   said first vertical portion includes two portions extending on two sides of said mounting portion along the direction matching the direction in which said trunk extends;
   said horizontal portion branches out between said two portions constituting said first vertical portion; and
   said second vertical portion is formed by bending the front end of said horizontal portion.

* * * * *